(12) United States Patent
Frech et al.

(10) Patent No.: US 6,424,058 B1
(45) Date of Patent: Jul. 23, 2002

(54) TESTABLE ON-CHIP CAPACITY

(75) Inventors: Roland Frech, Ostfildern; Erich Klink, Schoenaich; Jochen Supper, Herrenberg, all of (DE)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 09/672,809

(22) Filed: Sep. 28, 2000

(30) Foreign Application Priority Data

Nov. 27, 1999 (EP) .............................................. 99123649

(51) Int. Cl.⁷ ................................................ H02M 3/06
(52) U.S. Cl. ...................... 307/109; 307/112; 307/116; 307/125; 307/98; 307/99; 324/537
(58) Field of Search ................................ 307/109, 112, 307/116, 125, 98, 99; 324/537

(56) References Cited

U.S. PATENT DOCUMENTS

| | | | | |
|---|---|---|---|---|
| 5,366,931 A | * | 11/1994 | Kim ............................ | 437/209 |
| 5,506,457 A | * | 4/1996 | Krauter et al. ............... | 307/129 |
| 5,625,292 A | * | 4/1997 | Crook et al. ................. | 324/538 |
| 5,770,969 A | * | 6/1998 | Walls et al. ................. | 327/594 |

\* cited by examiner

Primary Examiner—Ronald W. Leja
Assistant Examiner—Robert L DeBeradinis
(74) Attorney, Agent, or Firm—Lynn L. Augspurger, Esq.; Kevin P. Radigan, Esq.; Heslin Rothenberg Farley & Mesiti P.C.

(57) ABSTRACT

The invention relates to a testable on-chip capacitor cell 10 including a decoupling capacitor ($C_i$) which can be disconnected from the power distribution network and discharged through a cell internal discharge circuit. An externally controllable switch ($S_i$) connects in a first switching position the decoupling capacitor to the power supply system and disconnects in a second switching position the decoupling capacitor from the power supply system and connects it to a resistor ($R_i$) which is part of the discharge circuit. An off-chip control unit (16) is provided for toggling the switch with a frequency $f_T$ between its first and second position to perform a capacitor test operation. By a current measurement device the averaged power supply current demand of the decoupling capacitor is measured when switch ($S_i$) is toggled. The actual capacity of the decoupling capacitor is determined as a function of the power supply voltage, of the switch toggling frequency ($f_T$) and of the averaged power supply current measured. The invention also relates to a semiconductor chip containing a plurality of capacitors cells of the type described, and to a method for testing the power supply decoupling capacity of such chips.

14 Claims, 4 Drawing Sheets

TESTABLE ON-CHIP CAPACITY

TECHNICAL FIELD

The invention relates to a testable on-chip capacitor cell including a decoupling capacitor which is connected to the chip power supply system for serving a high frequency current demand during highly synchronous on-chip switching activity. The invention also relates to an integrated semiconductor chip containing a plurality of testable decoupling capacitors and to a method for testing on-chip decoupling capacitors.

BACKGROUND ART

On-chip power supply decoupling capacitors are used to stabilize the on-chip power supply system of synchronously clocked CMOS chips. The highly synchronous on-chip switching activity and its associated high frequency current demand prevents to rely only on off-chip power supply decoupling capacitors. The inductive connection paths between on-chip switching circuitry and off-chip power supply decoupling capacitors do not allow to transfer high amounts of charge in a short time. The initial charge demand of an on-chip switching event has to be served first from on-chip power supply decoupling capacitors. Recharging of the on-chip decoupling capacitors from off-chip capacities happens afterwards with lower speed.

WO96/33495 discloses on-chip power supply decoupling capacitors which are directly connected to the on-chip power distribution network. The capacitors may be implemented by CMOS devices. The known circuit includes self-repairing capabilities by using a cross-coupled structure which reacts to a leakage current in one of the transistors to switch into another state. Such circuit facilitates the testability of the whole chip by reducing keeping leakage currents initiated by coupling capacitors. The circuit does not deal with the testability of on-chip power supply decoupling capacitors and the measurement of their actual capacity values.

SUMMARY OF THE INVENTION

It is an object of the invention to propose an on-chip power supply decoupling capacitor cell which is testable and which permits to measure its capacity value.

It is also an object of the invention to provide an integrated semiconductor chip including a plurality of testable and measurable on-chip power supply decoupling capacitors distributed over the chip area.

It is a further object of the invention to provide a method for testing and measuring on-chip power supply decoupling capacitors which are connected to a power supply distribution network.

According to the invention, as defined in the claims, an on-chip power supply decoupling capacitor cell is proposed which can be disconnected from the power distribution network and discharged through a cell internal discharge circuit. An externally controllable switch connects in a first switching position the decoupling capacitor to the power supply system and disconnects in a second switching position the decoupling capacitor from the power supply system and connects it instead to a resistor which is part of the discharge circuit. Control means are provided externally of the chip for toggling the switch with a frequency between its first and second position to perform a capacitor test operation. Furthermore, means are provided for measuring the power supply current of the decoupling capacitor when said switch is toggled and for determining the actual capacity of the decoupling capacitor.

The cell allows to test the on-chip power supply capacitor and to determine its capacity value by measuring the power supply current $I_{PS}$ during toggling of the control input of a switch which alternately connects the on-chip power supply capacitor to the power distribution network and the discharge resistor. The capacity value can be calculated from the measured power supply current $I_{PS}$, the power supply voltage $U_{PS}$ and the switch toggling frequency $f_T$.

Another aspect of the invention is to provide a semiconductor chip which contains a plurality of on-chip power supply decoupling capacitor cells according to the invention.

Furthermore, according to the invention a method is provided for testing and measuring on-chip power supply decoupling capacitors. The method comprises the step of toggling with a frequency $f_T$ a plurality of externally controllable on-chip switches each of which being assigned to one of a plurality of power supply decoupling capacitors to connect in a first switch position a first capacitor terminal to a power supply distribution network and to connect in a second switch position the first capacitor terminal through a discharge resistor to a line of the power supply distribution network to which line also a second capacitor terminal is connected. The method further comprises the steps of measuring the power supply current $I_{PS}$ of the power supply decoupling capacitors and of determining the actual capacity of the decoupling capacitors from the voltage applied to the power supply lines, the switch toggling frequency $f_T$ and the supply current measured.

The invention allows testability of power supply decoupling capacitors during manufacturing on wafer and/or module level which results in an improved product quality level. It also allows a capacity design verification in the presence of capacitive influences of a parasitic environment. Furthermore, the invention permits to assure defect free decoupling capacitors during the power-on phase and a verification of proper power supply stability in case of intermittent fails. The invention also provides an enhancement of the selftest capabilities and of reliability tests.

BRIEF DESCRIPTION OF THE DRAWINGS

In the following implementations of the invention are described with reference to drawings which show.

BEST MODE FOR CARRYING OUT THE INVENTION

Figure 1:
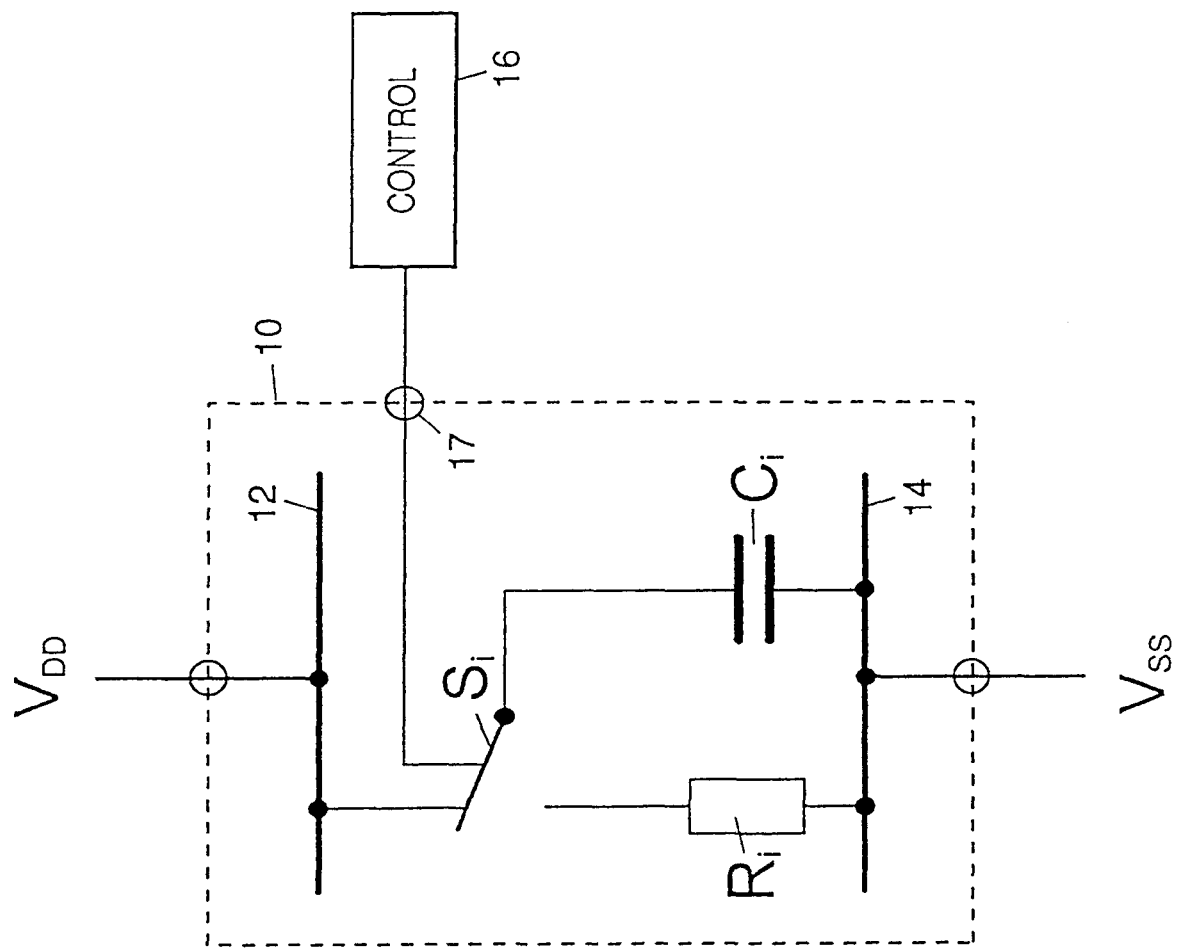
FIG. 1—a circuit diagram of an embodiment of the on-chip power supply decoupling capacitor cell according to the invention.

The capacitor cell 10 of FIG. 1 shows an on-chip power supply decoupling capacitor $C_i$ which is arranged between a first power supply line 12 and a second power supply line 14 which lines are part of the power supply distribution network of an integrated semiconductor chip. An off-chip power supply system applies to line 12 a voltage level $V_{DD}$ and to line 14 the voltage level $V_{SS}$. The voltage level $V_{DD}$ may be 1.8 volt and the voltage $V_{SS}$ may be ground level. A first terminal of capacitor $C_i$ is connected to line 14, while the second terminal of the capacitor 10 is connected to a switch $S_i$ which is implemented on the chip in well known manner as a transistor switching element. In a first position the switch $S_i$ connects capacitor $C_i$ to line 12, while in a second position the switch $S_i$ connects capacitor $C_i$ to a resistor $R_i$ which is arranged between: switch $S_i$ and line 14. Both the second terminal of the capacitor $C_i$ and the second terminal of the resistor $R_i$ are connected to the $V_{SS}$ so that resistor $R_i$ is part of a discharge path for capacitor $C_i$. The switch $S_i$ is operated by an off-chip control unit 16 which is connected to the capacitor cell 10 via a single terminal 17. Capacitor $C_i$, resistor $R_i$ and switch $S_i$ are implemented on the integrated semiconductor chip by means of transistors in CMOS technology.

Switch $S_i$ connects capacitor $C_i$ to the on-chip power supply network during the normal operation mode of the cell 10. For performing a test operation of the capacitor $C_i$ the switch $S_i$ is operated by the control unit 16 in a manner that it alternates between its first and second position with a frequency $f_T$. During this switching operation, which is subsequently called 'toggling', the capacitor $C_i$ is repeatedly charged and discharged.

Figure 2:
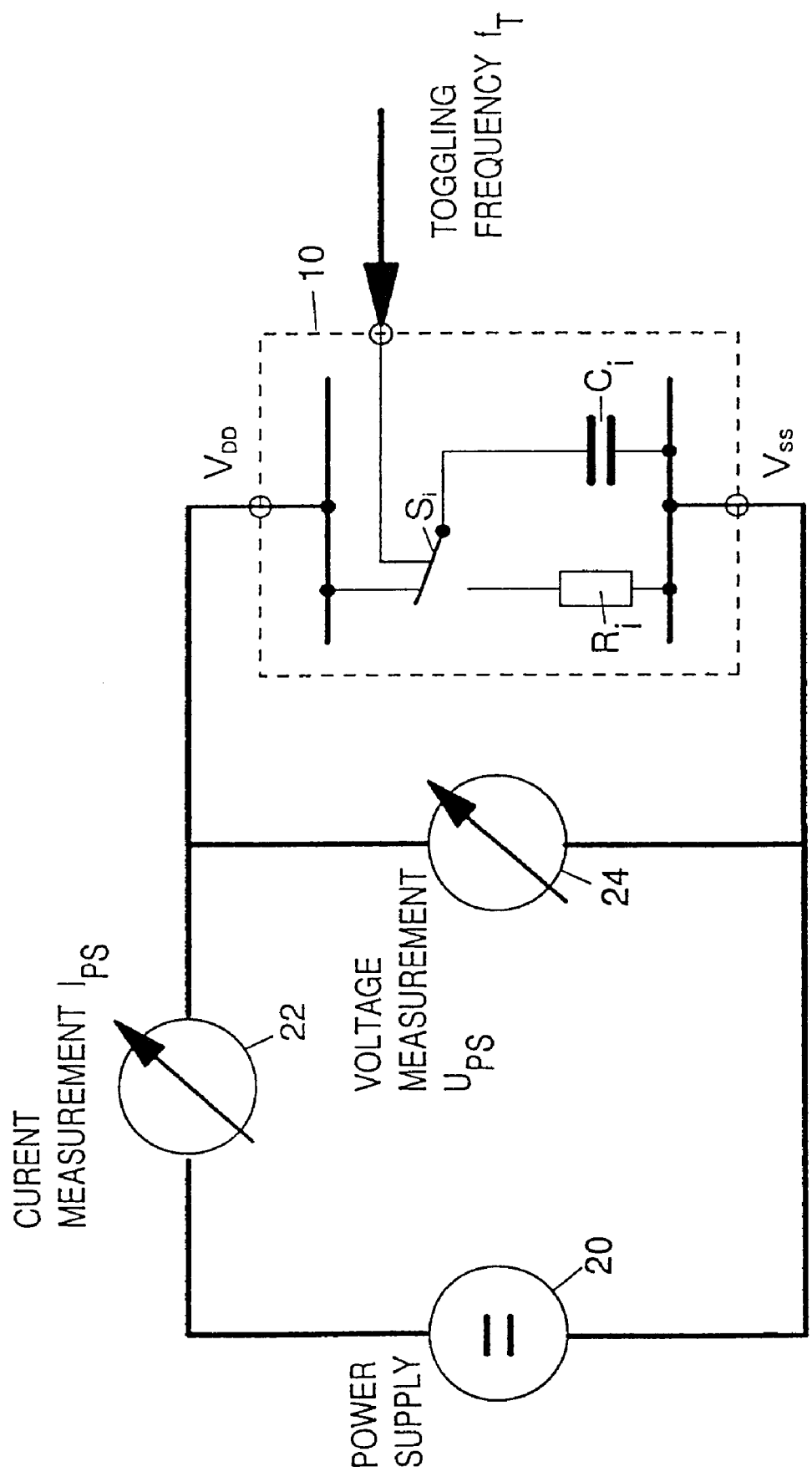
FIG. 2—a circuit diagram of the test environment for the decoupling capacitor cell according to FIG. 1.

As shown in FIG. 2 an off-chip power supply 20 provides a current $I_{PS}$ to the capacitor $C_i$. An current measurement instrument 22 and a voltage measurement instrument 24 both arranged outside of the chip and connected to the power supply 20 are used to measure the averaged current $I_{PS}$ and the power supply voltage $U_{PS}$ during the toggling operation of the switch $S_i$. The measurement of voltage $U_{PS}$ is performed to take into consideration the voltage drop in the power supply lines during the toggling operation of the switch $S_i$ and thus allows to determine the actual capacity of $C_i$ with a higher accuracy.

If the current $I_{PS}$ and the voltage $U_{PS}$ are measured and toggling frequency $f_T$ is known, the actual capacity of $C_i$ can be calculated by using the relationship:

$$C_i = \frac{I_{PS}}{U_{PS} * f_T}$$

A comparison of the calculated current capacity with the nominal capacity according to the design specification of the cell 10 allows to determine the status and the correct operation of the capacitor $C_i$. This comparison may be performed by the software which is used to control the test operation.

In an implementation example of the cell 10 the capacitor $C_i$ may have the value of 1 pF and the resistor $R_i$ may have the value of 1000 Ohm. The switch toggling frequency $f_T$ is preferably chosen substantially below the frequency which is determined by the RC time constant $T_k$:

$$f_T << 1/T_k, \quad T_k = R_i * C_i$$

Figure 3:
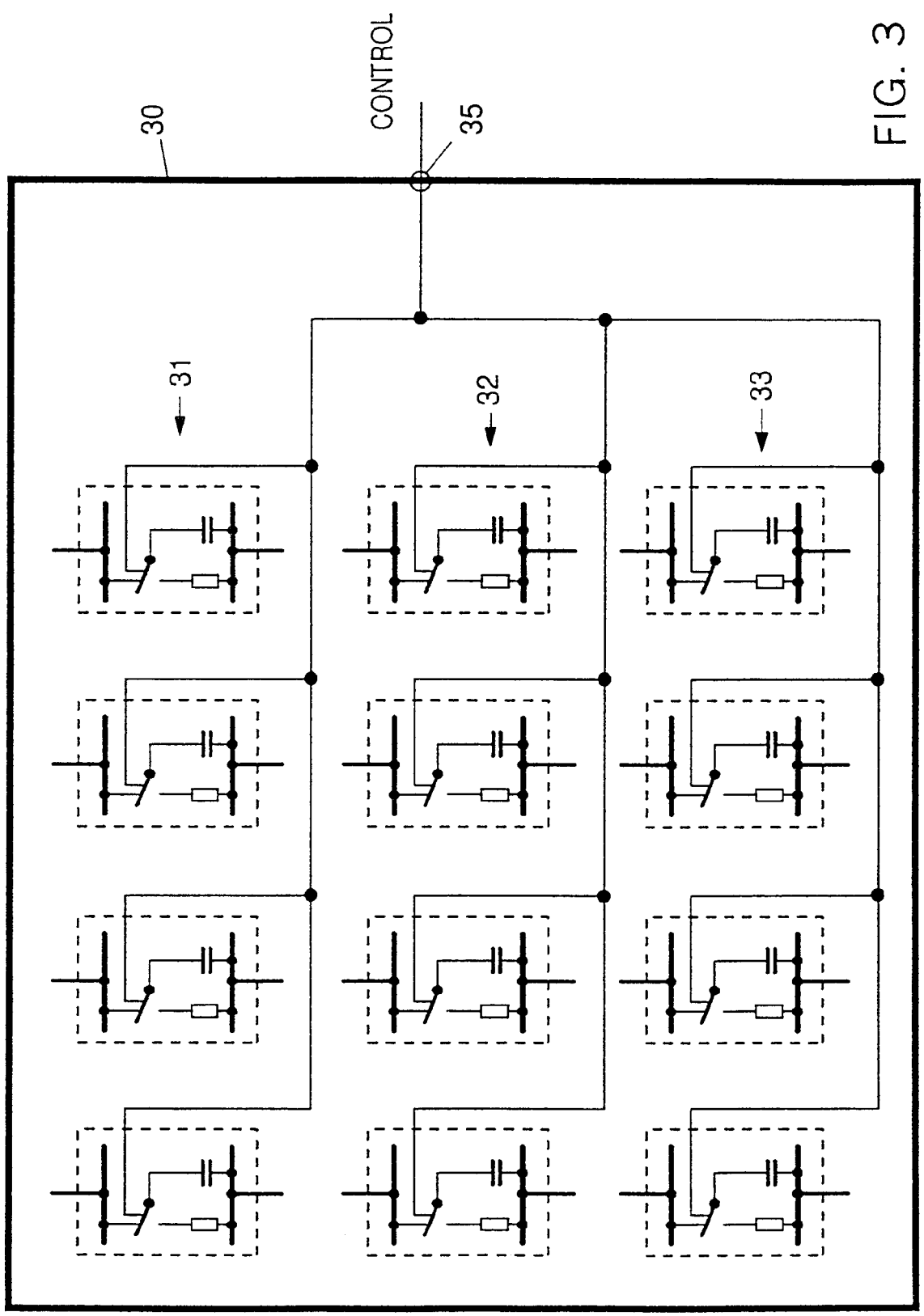
FIG. 3—a circuit diagram of a semiconductor chip containing three jointly controlled groups each of which may include a plurality of capacitor cells according to FIGS. 1 and 2.

A plurality of power supply decoupling capacitor cells of the type as shown in FIG. 1 are distributed over a semiconductor chip 30 to cover the charge demand of on-chip switching events. The decoupling capacitor cells are preferably located close to the major current consuming circuits. FIG. 3 shows an example of a chip 30 which contains three groups of capacitor cells each having four cells 31, 32, 33 according to the cell 10 of FIG. 1. In practice the chip 30 may contain much more groups each containing a large number of capacitor cells. The control of the switches $S_i$ of all three groups takes place in parallel by control signals which are applied to the chip 30 from an external control unit (not shown) through a single terminal 35. The operation of the capacitor cells 31, 32, 33 correspond to the operation described above with reference to FIGS. 1 and 2. All capacitors are tested in parallel and the current and voltage measurements described with reference to FIG. 2 are performed simultaneously for all capacitors. The test results of the measurement thus relates to the total capacity of all decoupling capacitors cells installed on the chip 30.

Figure 4:
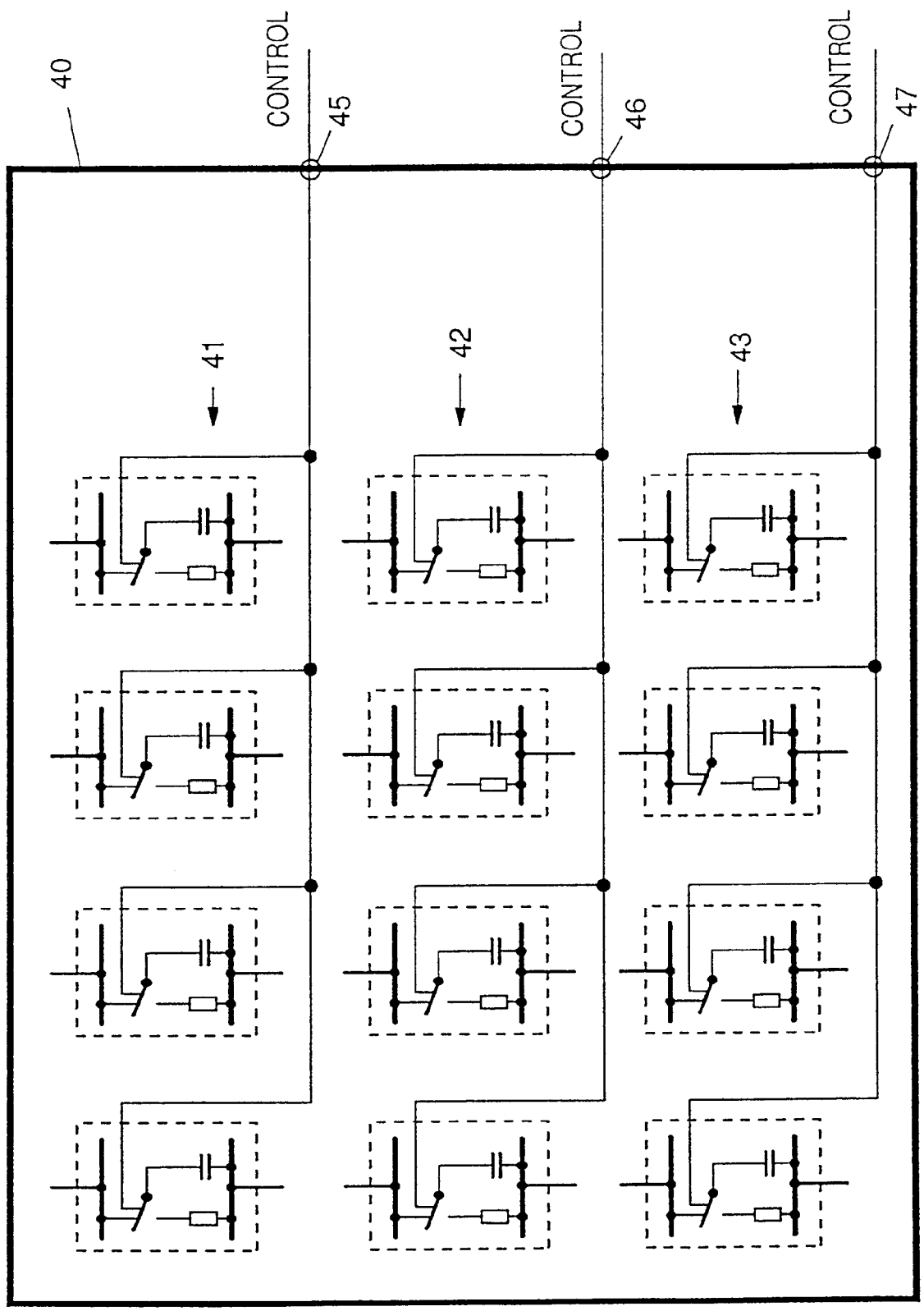
FIG. 4—a circuit diagram of a semiconductor chip which contains three separately controlled groups of capacitor cells according to FIGS. 1 and 2.

FIG. 4 shows a chip 40 comprising a separate control of each of three groups of the capacitors cells 41, 42, 43 through terminals 45, 46, 47 each connected to a separate control signal channel. In this way each group of capacitor cells 41, 42, 43 may be tested separately by applying control signals to a selected one of the terminals 45, 46, 47. For such a test the current and voltage measurement circuitry may be common to all three groups.

What is claimed is:

1. A testable on-chip capacitor cell including a decoupling capacitor ($C_i$) which is connected to a power supply network including a first power line (12) having a first voltage level and a second power line (14) having a second voltage level, said decoupling capacitor serves a high frequency current demand during highly synchronous on-chip switching activity, the capacitor cell comprising:

an externally controllable switch ($S_i$) connected to a first terminal of the said decoupling capacitor ($C_i$) and having a first switching position to connect said decoupling capacitor to the first power supply line (12) and a second switching position to disconnect the decoupling capacitor from said first power supply line and to connect it through a discharge path to said second power supply line (14) to which also a second terminal of the capacitor ($C_i$) is connected;

a discharge resistor ($R_i$) being arranged in said discharge path between the externally controllable switch ($S_i$) and the second power supply line (14) when said switch ($S_i$) is in its second switching position;

off-chip control means (16) for toggling the switch ($S_i$) with a frequency $f_T$ between its first and second switching position to perform a decoupling capacitor test operation;

measuring means (20) for determining the actual power supply current $I_{PS}$ of repeatedly charging the decoupling capacitor ($C_i$) when said switch ($S_i$) is toggled; and means for determining the actual capacity of the decoupling capacitor ($C_i$) as a function of the voltage applied to the power supply lines, the switch toggling frequency $f_T$ and the power supply current measured.

2. A capacitor cell according to claim 1, wherein said measuring means (20) for determining the actual capacity of the decoupling capacitor ($C_i$) using the relation $$C_i = \frac{I_{PS}}{U_{PS} * f_T}$$

wherein $I_{PS}$ is the averaged power supply current measured, $U_{PS}$ is the voltage of the power supply and $f_T$ is the switch toggling frequency.

3. A capacitor cell according to claim 1, wherein the switch toggling frequency $f_T$ is substantially below the frequency which is determined by the $R_c$ time constant $T_k$ of the decoupling capacitor ($C_i$) and discharge resistor ($R_i$) according to:

$$f_T \ll 1/T_k, \quad T_k = R_i * C_i.$$

4. An integrated semiconductor chip (30) including a plurality of testable decoupling capacitors ($C_i$) which are connected to a power supply distribution network including a first power line having a first voltage level and a second power line having a second voltage level, said decoupling capacitors serve a high frequency current demand during highly synchronous on-chip switching activities, comprising:

a plurality of externally controllable switches ($S_i$) each assigned to one of said decoupling capacitors ($C_i$) and having a first switching position to connect a first terminal of the decoupling capacitor to said first power supply line and a second switching position to disconnect the first terminal of the decoupling capacitor from the first power supply line and to connect it through a discharge path to said second power supply line to which also a second terminal of that capacitor is connected;

each of said plurality of externally controllable switches ($S_i$) is connected to a discharge resistor ($R_i$) which is arranged in said discharge path between said first terminal of the assigned capacitor and said second power supply line when the switch is in its second switching position;

control means arranged externally of the chip and connected to at least a part of the plurality of switches ($S_i$) for toggling them with a frequency $f_T$ between their first and second switching positions to perform a decoupling capacitor test operation;

measuring means for determining the actual averaged power supply current $I_{PS}$ of repeatedly charging the decoupling capacitors ($C_i$) the switches ($S_i$) of which are toggled; and means for determining the actual capacity of the decoupling capacitors ($C_i$) the switches ($S_i$) of which are toggled as a function of the voltage applied to the power supply lines, the switch toggling frequency $f_T$ and the averaged power supply current measured.

5. A chip according to claim 4, wherein said measuring means for determining the actual capacity of the plurality of decoupling capacitors ($C_i$) have implemented the function $$C_i = \frac{I_{PS}}{U_{PS} * f_T}$$

wherein $I_{PS}$ is the averaged power supply current measured, $U_{PS}$ is the voltage of the power supply and $f_T$ is the switch toggling frequency.

6. A chip according to claim 4, comprising measuring means for determining the actual voltage applied to the plurality of decoupling capacitors ($C_i$) through the switches ($S_i$) which are toggled, and wherein said means for determining the actual capacity of the plurality of decoupling capacitors ($C_i$) use the measured voltage as voltage $U_{PS}$ as it is applied to said power supply lines.

7. A chip according to claim 4, wherein the switch toggling frequency $f_T$ is substantially below the frequency which is determined by the $R_c$ time constant $T_k$ of the decoupling capacitor ($C_i$) and discharge resistor ($R_i$) according to:

$$f_T \ll 1/T_k, \quad T_k = R_i * C_i.$$

8. A chip according to claim 4, wherein the externally controllable switches ($S_i$) of said plurality of decoupling capacitors ($C_i$) being controlled in parallel by said external control device through a single chip terminal (17).

9. A chip according to claim 4, wherein the externally controllable switches ($S_i$) of said plurality of decoupling capacitors ($C_i$) are divided in groups and wherein the controllable switches ($S_i$) each of said groups being controlled in parallel by said external control device through a separate chip terminal (41, 42, 43).

10. A method for testing on-chip decoupling capacitors ($C_i$) which are connected to a power supply distribution network including a first power line (12) having a first voltage level and a second power line (14) having a second voltage level, said capacitors are charged in parallel to meet a high frequency current demand during highly synchronous on-chip switching activities, said method comprising:

toggling a plurality of externally controllable on-chip switches ($S_i$) with a frequency $f_T$, each of said switches which being assigned to one of said decoupling capacitors ($C_i$) to connect in a first switch position a first terminal of that capacitor ($C_i$) to the first power line (12) and to connect in a second switch position the first terminal of that capacitor ($C_i$) through a discharge resistor ($R_i$) to the second power line (14);

measuring the averaged power supply current IPS of the decoupling capacitors ($C_i$); and determining the actual capacity of the decoupling capacitors as a function of the voltage applied to the power supply lines, the switch toggling frequency $f_T$ and the measured averaged power supply current.

11. A method according to claim 10, wherein the step of determining the actual capacity of the plurality of decoupling capacitors ($C_i$) use the function $$C_i = \frac{I_{PS}}{U_{PS} * f_T}$$

wherein $I_{PS}$ is the averaged power supply current measured, $U_{PS}$ is the voltage of the power supply and $f_T$ is the switch toggling frequency.

12. A method according to claim 10, wherein the switch toggling frequency $f_T$ is substantially below the frequency which is determined by the RC time constant $T_k$ of the decoupling capacitor ($C_i$) and discharge resistor ($R_i$) according to:

$$f_T \ll 1/T_k, \quad T_k = R_i * C_i.$$

13. A method according to claim 10, comprising measuring the actual voltage applied to the plurality of decoupling capacitors ($C_i$) the switches ($S_i$) of which are toggled, and determining the actual capacity of the plurality of decoupling capacitors ($C_i$) by using the measured voltage as voltage UPS applied to the power supply lines.

14. A method according to claim 10, wherein at least a part of the externally controllable switches ($S_i$) of said plurality of decoupling capacitors ($C_i$) are controlled in parallel through a single chip terminal.

* * * * *